(12) United States Patent
Sun et al.

(10) Patent No.: US 12,416,855 B2
(45) Date of Patent: Sep. 16, 2025

(54) PHOTOMASK STRUCTURE

(71) Applicant: United Microelectronics Corp., Hsinchu (TW)

(72) Inventors: Chia-Chen Sun, Kaohsiung (TW); Song-Yi Lin, Tainan (TW); En-Chiuan Liou, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 577 days.

(21) Appl. No.: 17/878,026

(22) Filed: Jul. 31, 2022

(65) Prior Publication Data

US 2024/0012322 A1  Jan. 11, 2024

(30) Foreign Application Priority Data

Jul. 6, 2022 (TW) .................................. 111125253

(51) Int. Cl.
*G03F 1/38* (2012.01)
*G03F 1/26* (2012.01)

(52) U.S. Cl.
CPC . *G03F 1/38* (2013.01); *G03F 1/26* (2013.01)

(58) Field of Classification Search
CPC ...................................... G03F 1/26; G03F 1/38
See application file for complete search history.

(56) References Cited

U.S. PATENT DOCUMENTS

| | | | |
|---|---|---|---|
| 7,003,757 B2 | 2/2006 | Pierrat et al. | |
| 7,354,681 B2 * | 4/2008 | Laidig | G03F 1/36 430/30 |
| 7,908,572 B2 | 3/2011 | Zhang | |
| 2002/0142597 A1 * | 10/2002 | Park | G03F 1/36 438/689 |
| 2004/0023132 A1 * | 2/2004 | Akiyama | H01L 23/544 257/E23.179 |
| 2011/0173578 A1 * | 7/2011 | Tsai | G03F 1/36 716/55 |
| 2012/0145668 A1 * | 6/2012 | Riege | G03F 1/38 430/326 |
| 2019/0033702 A1 * | 1/2019 | Zhang | G06F 30/398 |
| 2020/0192996 A1 * | 6/2020 | Kang | G03F 1/36 |

* cited by examiner

*Primary Examiner* — Stewart A Fraser
(74) *Attorney, Agent, or Firm* — JCIPRNET

(57) ABSTRACT

A photomask structure including a layout pattern and at least one assist pattern is provided. The layout pattern includes corners. The assist pattern wraps at least one of the corners. There is a gap between the edge of the layout pattern and the assist pattern.

16 Claims, 1 Drawing Sheet

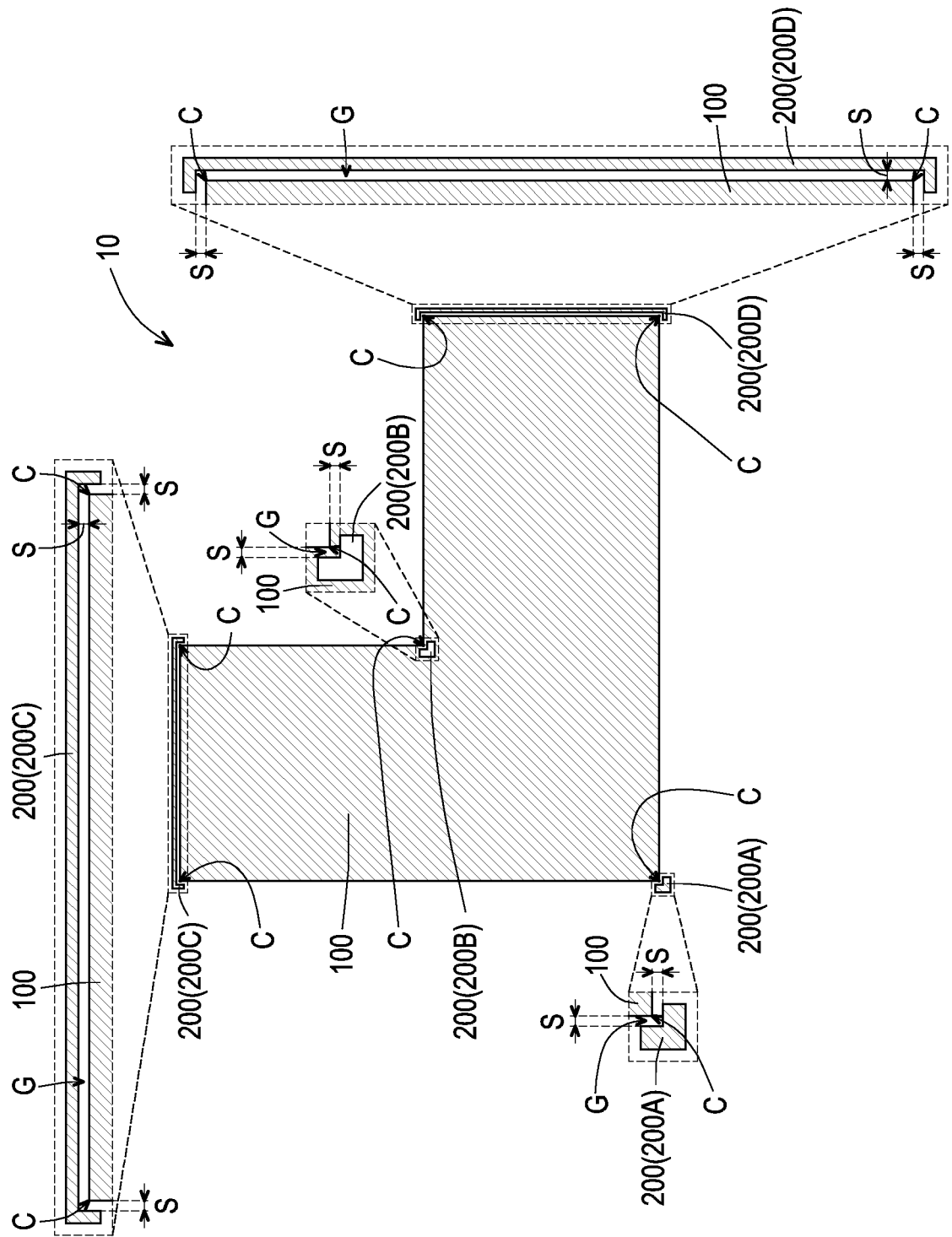

PHOTOMASK STRUCTURE

CROSS-REFERENCE TO RELATED APPLICATION

This application claims the priority benefit of Taiwan application serial no. 111125253, filed on Jul. 6, 2022. The entirety of the above-mentioned patent application is hereby incorporated by reference herein and made a part of this specification.

BACKGROUND

Technical Field

The invention relates to a photomask structure, and particularly relates to a photomask structure including an assist pattern.

Description of Related Art

In the semiconductor manufacturing process, the lithography technology plays an important role. However, the photoresist pattern formed by the lithography process often has the problem of corner rounding. Therefore, how to develop a photomask that can reduce the corner rounding is the goal of continuous efforts.

SUMMARY

The invention provides a photomask structure, which can effectively reduce the corner rounding of the photoresist pattern formed by the lithography process.

The invention provides a photomask structure, which includes a layout pattern and at least one assist pattern. The layout pattern includes corners. The assist pattern wraps at least one of the corners. There is a gap between the edge of the layout pattern and the assist pattern.

According to an embodiment of the invention, in the photomask structure, the spacing between the edge of the layout pattern and the assist pattern may be the minimum spacing specified by the design rule.

According to an embodiment of the invention, in the photomask structure, the edge of the layout pattern and the assist pattern are not in contact with each other.

According to an embodiment of the invention, in the photomask structure, the assist pattern may be located outside the layout pattern.

According to an embodiment of the invention, in the photomask structure, the assist pattern may be located inside the layout pattern.

According to an embodiment of the invention, in the photomask structure, the assist pattern may wrap at least two of the corners.

According to an embodiment of the invention, in the photomask structure, the shape of the assist pattern may include an L-shape.

According to an embodiment of the invention, in the photomask structure, the shape of the assist pattern may include a U-shape.

According to an embodiment of the invention, in the photomask structure, the assist pattern may be a serif.

According to an embodiment of the invention, in the photomask structure, the assist pattern may be a hammerhead.

According to an embodiment of the invention, in the photomask structure, the layout pattern may be an opaque pattern or a phase shift pattern.

According to an embodiment of the invention, in the photomask structure, the assist pattern located outside the layout pattern may be an opaque pattern or a phase shift pattern.

According to an embodiment of the invention, in the photomask structure, the assist pattern located inside the layout pattern may be a light-transmitting pattern.

According to an embodiment of the invention, in the photomask structure, the layout pattern may be a light-transmitting pattern.

According to an embodiment of the invention, in the photomask structure, the assist pattern located outside the layout pattern may be a light-transmitting pattern.

According to an embodiment of the invention, in the photomask structure, the assist pattern located inside the layout pattern may be an opaque pattern or a phase shift pattern.

Based on the above description, the photomask structure according to the invention includes a layout pattern and at least one assist pattern, the assist pattern wraps at least one of the corners of the layout pattern, and there is a gap between the edge of the layout pattern and the assist pattern. Therefore, when the lithography process is performed by using the above photomask structure, the pattern fidelity of the lithography process can be improved. In this way, when the lithography process is performed by using the above photomask structure, the corner rounding of the photoresist pattern formed by the lithography process can be effectively reduced, and the process window of the semiconductor process can be improved.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

The FIGURE is a schematic view illustrating a photomask structure according to some embodiments of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

The FIGURE is a schematic view illustrating a photomask structure according to some embodiments of the invention.

Referring to the FIGURE, a photomask structure 10 includes a layout pattern 100 and at least one assist pattern 200. In some embodiments, the photomask structure 10 may be a binary mask or a phase shift mask (PSM), but the invention is not limited thereto.

The layout pattern 100 includes corners C. The layout pattern 100 may be the main pattern on the photomask structure 10. In addition, the shape of the layout pattern 100 may be determined according to the product design and is not limited to the shape in the FIGURE.

In the present embodiment, the number of assist patterns 200 is, for example, multiple, but the invention is not limited thereto. As long as the photomask structure 10 includes at least one assist pattern 200, it falls within the scope of the invention. The assist pattern 200 can be used to improve the pattern fidelity of the lithography process. In some embodiments, when the photomask structure 10 includes a plurality of assist patterns 200, the assist patterns 200 may be separated from each other. For example, the assist pattern 200A, the assist pattern 200B, the assist pattern 200C, and the assist pattern 200D may be separated from each other.

The assist pattern 200 wraps at least one of the corners C. In some embodiments, the assist pattern 200 may wrap at least two of the corners C. For example, the assist pattern 200A may wrap one corner C, the assist pattern 200B may wrap one corner C, the assist pattern 200C may wrap two corners C, and the assist pattern 200D may wrap two corners C. As long as the assist pattern 200 wraps at least one of the corners C, it falls within the scope of the invention.

There is a gap G between the edge of the layout pattern 100 and the assist pattern 200, thereby improving the pattern fidelity of the lithography process. Therefore, the corner rounding of the photoresist pattern formed by the lithography process can be effectively reduced. The spacing S between the edge of the layout pattern 100 and the assist pattern 200 may be the minimum spacing specified by the design rule. In some embodiments, the edge of the layout pattern 100 and the assist pattern 200 are not in contact with each other.

In some embodiments, the assist pattern 200 may be located outside the layout pattern 100. For example, the assist pattern 200A, the assist pattern 200C, and the assist pattern 200D may be located outside the layout pattern 100. In some embodiments, the assist pattern 200 may be located inside the layout pattern 100. For example, the assist pattern 200B may be located inside the layout pattern 100.

In some embodiments, the shape of the assist pattern 200 may include an L-shape. For example, the shape of the assist pattern 200A and the shape of the assist pattern 200B may be an L-shape. In some embodiments, the shape of the assist pattern 200 may include a U-shape. For example, the shape of the assist pattern 200C and the shape of the assist pattern 200D may be a U-shape.

In some embodiments, the assist pattern 200 may be a serif or a hammerhead. For example, the assist pattern 200A and the assist pattern 200B may be serifs, and the assist pattern 200C and the assist pattern 200D may be hammerheads.

In some embodiments, the layout pattern 100 may be an opaque pattern or a phase shift pattern, and the assist pattern 200 located outside the layout pattern 100 may be an opaque pattern or a phase shift pattern, and the assist pattern 200 located inside the layout pattern 100 may be a light-transmitting pattern. For example, when the photomask structure 10 is a binary mask, the layout pattern 100 may be an opaque pattern, the assist pattern 200 located outside the layout pattern 100 may be an opaque pattern, and the assist pattern 200 located inside the layout pattern 100 may be a light-transmitting pattern. In addition, when the photomask structure 10 is a phase shift mask, the layout pattern 100 may be a phase shift pattern, the assist pattern 200 located outside the layout pattern 100 may be a phase shift pattern, and the assist pattern 200 located inside the layout pattern 100 may be a light-transmitting pattern.

In some embodiments, the layout pattern 100 may be a light-transmitting pattern, the assist pattern 200 located outside the layout pattern 100 may be a light-transmitting pattern, and the assist pattern 200 located inside the layout pattern 100 may be an opaque pattern or a phase shift pattern. For example, when the photomask structure 10 is a binary mask, the layout pattern 100 may be a light-transmitting pattern, the assist pattern 200 located outside the layout pattern 100 may be a light-transmitting pattern, and the assist pattern 200 located inside the layout pattern 100 may be an opaque pattern. In addition, when the photomask structure 10 is a phase shift mask, the layout pattern 100 may be a light-transmitting pattern, the assist pattern 200 located outside the layout pattern 100 may be a light-transmitting pattern, and the assist pattern 200 located inside the layout pattern 100 may be a phase shift pattern.

In some embodiments, the light transmittance of the opaque pattern may be 0%. In some embodiments, the light transmittance of the phase shift pattern may be 3% to 15%. In some embodiments, the light transmittance of the light-transmitting pattern may be 100%. In some embodiments, the phase difference between the light passing through the phase shift pattern and the light passing through the light-transmitting pattern may be 180 degrees.

In some embodiments, the photomask structure 10 may further include a transparent substrate (not shown), and the layout pattern 100 and the assist pattern 200 may be located on the transparent substrate. The transparent substrate of the photomask structure 10 is well known to one of ordinary skill in the art, and the description thereof is omitted here.

Based on the above embodiments, the photomask structure 10 includes a layout pattern 100 and at least one assist pattern 200, the assist pattern 200 wraps at least one of the corners C of the layout pattern 100, and there is a gap G between the edge of the layout pattern 100 and the assist pattern 200. Therefore, when the lithography process is performed by using the above photomask structure 10, the pattern fidelity of the lithography process can be improved. In this way, when the lithography process is performed by using the above photomask structure 10, the corner rounding of the photoresist pattern formed by the lithography process can be effectively reduced, and the process window of the semiconductor process can be improved.

In summary, in the photomask structure of the aforementioned embodiments, the assist pattern wraps at least one of the corners of the layout pattern, and there is a gap between the edge of the layout pattern and the assist pattern, so that the pattern fidelity of the lithography process can be improved. In this way, when the lithography process is performed by using the above photomask structure, the corner rounding of the photoresist pattern formed by the lithography process can be effectively reduced, and the process window of the semiconductor process can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A photomask structure, comprising:
 a layout pattern comprising corners; and
 at least one assist pattern, wherein the at least one assist pattern wraps at least one of the corners, there is a gap between an edge of the layout pattern and the at least one assist pattern, the at least one assist pattern does not wrap an entirety of the layout pattern, the at least one assist pattern comprises at least one recess, and the at least one of the corners is located in the at least one recess.

2. The photomask structure according to claim 1, wherein a spacing between the edge of the layout pattern and the at least one assist pattern is a minimum spacing specified by a design rule.

3. The photomask structure according to claim 1, wherein the edge of the layout pattern and the at least one assist pattern are not in contact with each other.

4. The photomask structure according to claim 1, wherein the at least one assist pattern is located outside the layout pattern.

5. The photomask structure according to claim 1, wherein the at least one assist pattern is located inside the layout pattern.

6. The photomask structure according to claim 1, wherein the at least one assist pattern wraps at least two of the corners.

7. The photomask structure according to claim 1, wherein a shape of the at least one assist pattern comprises an L-shape.

8. The photomask structure according to claim 1, wherein a shape of the at least one assist pattern comprises a U-shape.

9. The photomask structure according to claim 1, wherein the at least one assist pattern comprises a serif.

10. The photomask structure according to claim 1, wherein the at least one assist pattern comprises a hammerhead.

11. The photomask structure according to claim 1, wherein the layout pattern comprises an opaque pattern or a phase shift pattern.

12. The photomask structure according to claim 11, wherein the at least one assist pattern located outside the layout pattern comprises an opaque pattern or a phase shift pattern.

13. The photomask structure according to claim 11, wherein the at least one assist pattern located inside the layout pattern comprises a light-transmitting pattern.

14. The photomask structure according to claim 1, wherein the layout pattern comprises a light-transmitting pattern.

15. The photomask structure according to claim 14, wherein the at least one assist pattern located outside the layout pattern comprises a light-transmitting pattern.

16. The photomask structure according to claim 14, wherein the at least one assist pattern located inside the layout pattern comprises an opaque pattern or a phase shift pattern.

* * * * *